(12) United States Patent
Mizobe

(10) Patent No.: US 11,415,282 B2
(45) Date of Patent: *Aug. 16, 2022

(54) LED MODULE FOR FLASHING LAMP AND FLASHING LAMP

(71) Applicant: HotaluX, Ltd., Tokyo (JP)

(72) Inventor: Norimasa Mizobe, Tokyo (JP)

(73) Assignee: HotaluX, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/314,164

(22) Filed: May 7, 2021

(65) Prior Publication Data

US 2021/0332962 A1  Oct. 28, 2021

Related U.S. Application Data

(63) Continuation of application No. 16/895,748, filed on Jun. 8, 2020, now Pat. No. 11,041,597, which is a
(Continued)

(30) Foreign Application Priority Data

Jan. 31, 2017 (JP) ................. 2017-016036

(51) Int. Cl.
*F21S 10/06* (2006.01)
*B64F 1/20* (2006.01)
(Continued)

(52) U.S. Cl.
CPC ............... *F21S 10/06* (2013.01); *B64F 1/20* (2013.01); *H01L 25/0753* (2013.01);
(Continued)

(58) Field of Classification Search
CPC ........ F21S 10/06; B64F 1/20; F21W 2111/06; F21Y 2115/10; F21Y 2105/18;
(Continued)

(56) References Cited

U.S. PATENT DOCUMENTS 10,711,965 B2  7/2020  Mizobe
11,041,597 B2 *  6/2021  Mizobe ................. B64F 1/20
(Continued)

FOREIGN PATENT DOCUMENTS

JP  2006-156287 A  6/2006
JP  2007-088462 A  4/2007
(Continued)

OTHER PUBLICATIONS

Communication dated Sep. 16, 2019 from Australian Patent Office in counterpart AU Application No. 2017396687.
(Continued)

*Primary Examiner* — Joseph L Williams
*Assistant Examiner* — Jose M Diaz
(74) *Attorney, Agent, or Firm* — Sughrue Mion, PLLC

(57) ABSTRACT

The present invention provides an LED module that can prevent breakage of an LED chip due to pulse lighting for a flash when the LED module is used in a flashing lamp. An LED module (10) for flashing lamp includes: an LED substrate (13); plural LEDs (12); and plural resin layers (11). In the LED module (10), the LEDs (12) are mounted on a mounting surface of the LED substrate (13). Each resin layer (11) is stacked on a surface of each LED (12) opposite to the LED substrate (13). Adjacent resin layers (11) stacked on the LEDs (12) are separated from each other.

6 Claims, 3 Drawing Sheets

Related U.S. Application Data continuation of application No. 16/338,369, filed as application No. PCT/JP2017/042268 on Nov. 24, 2017, now Pat. No. 10,711,965.

(51) Int. Cl.
| | | |
|---|---|---|
| *H01L 25/075* | (2006.01) | |
| *H01L 33/50* | (2010.01) | |
| *F21Y 105/12* | (2016.01) | |
| *F21Y 115/10* | (2016.01) | |
| *F21W 111/06* | (2006.01) | |

(52) U.S. Cl.
CPC ........ *H01L 33/502* (2013.01); *F21W 2111/06* (2013.01); *F21Y 2105/12* (2016.08); *F21Y 2115/10* (2016.08)

(58) Field of Classification Search
CPC . F21Y 2105/12; B64D 2203/00; F21V 15/00; H01L 25/0753; H01L 33/50; H01L 33/502
See application file for complete search history.

(56) References Cited

U.S. PATENT DOCUMENTS

| | | |
|---|---|---|
| 2007/0064420 A1 | 3/2007 | Ng et al. |
| 2010/0200872 A1 | 8/2010 | Takashima |
| 2011/0193108 A1 | 8/2011 | Wu et al. |
| 2011/0292302 A1 | 12/2011 | Park et al. |
| 2014/0175492 A1 | 6/2014 | Steranka et al. |
| 2015/0176807 A1 | 6/2015 | Park et al. |
| 2015/0338048 A1 | 11/2015 | Ahn et al. |
| 2017/0025582 A1 | 1/2017 | Dai et al. |
| 2019/0257499 A1 | 8/2019 | Fujikawa et al. |

FOREIGN PATENT DOCUMENTS

| | | |
|---|---|---|
| JP | 2007-137187 A | 6/2007 |
| JP | 2008-112628 A | 5/2008 |
| JP | 2010-182495 A | 8/2010 |
| JP | 2010-247576 A | 11/2010 |
| JP | 2014-123738 A | 7/2014 |
| JP | 2015-115380 A | 6/2015 |

OTHER PUBLICATIONS

International Search Report of PCT/JP2017/042268 dated Dec. 26, 2017 [PCT/ISA/210].
Notice of Reasons for Refusal dated Sep. 14, 2021 from the Japanese Patent Office in JP Application No. 2018-565957.

\* cited by examiner

LED MODULE FOR FLASHING LAMP AND FLASHING LAMP

CROSS-REFERENCE TO RELATED APPLICATIONS

This application is a continuation of U.S. application Ser. No. 16/895,748 filed Jun. 8, 2020 which is a continuation of U.S. application Ser. No. 16/338,369 filed Mar. 29, 2019, which is a National Stage of International Application No. PCT/JP2017/042268 filed Nov. 24, 2017, claiming priority to Japanese Patent Application No. 2017-016036 filed Jan. 31, 2017, the contents of all of which are incorporated herein by reference in their entirety.

TECHNICAL FIELD

The present invention relates to an LED module for flashing lamp and a flashing lamp.

BACKGROUND ART

Flashing devices using xenon lamps as light sources are used for guiding a landing aircraft to a runway in an airport or the like (see Patent Literatures 1 to 4).

CITATION LIST

Patent Literature

Patent Literature 1: JP 2006-156287 A
Patent Literature 2: JP 2008-112628 A
Patent Literature 3: JP 2010-182495 A
Patent Literature 4: JP 2010-247576 A

SUMMARY OF INVENTION

Technical Problem

If the above-described xenon lamp can be replaced with a light emitting diode (LED) lamp, it is possible to greatly extend the life of the lamp and reduce the power consumption. Hence, the inventors of the present invention have intensively researched on a flashing lamp provided with an LED as a light source. However, it has been found that when an LED is used, the LED chip may be damaged due to pulse lighting for a flash.

Hence, it is an object of the present invention to provide an LED module that can prevent breakage of an LED chip due to pulse lighting for a flash when the LED module is used in a flashing lamp.

Solution to Problem

In order to achieve the above object, according to one aspect of the present invention, is provided an LED module for flashing lamp which includes: an LED substrate plural LEDs and plural resin layers. In the LED module, the LEDs are mounted on a mounting surface of the LED substrate. Each resin layer is stacked on a surface of each LED opposite to the LED substrate. Adjacent resin layers stacked on the LEDs are separated from each other.

According to another aspect of the present invention, there is provided a flashing lamp which includes: an LED module serving as a light source; a light distribution unit; a housing having an opening; and a light transmissive cover. In the flashing lamp. the LED module is the module for flashing lamp according to the present invention. The LED module and the light distribution unit are disposed inside the housing. The light distribution unit is disposed on a light emission side of the LED module. The light transmissive cover is disposed over the opening of the housing.

Advantageous Effects of Invention

According to the LED module of the present invention, even if the LED module is used in a flashing lamp, breakage of a LED chip due to pulse lighting for a flash can be prevented.

BRIEF DESCRIPTION OF DRAWINGS

FIG. 1A is a plan view. FIG. 1B is a partial plan view of FIG. 1A. FIG. 1C is a cross-sectional view taken along the line I-I in FIG. 1B.

DESCRIPTION OF EMBODIMENTS

Figure 1A:
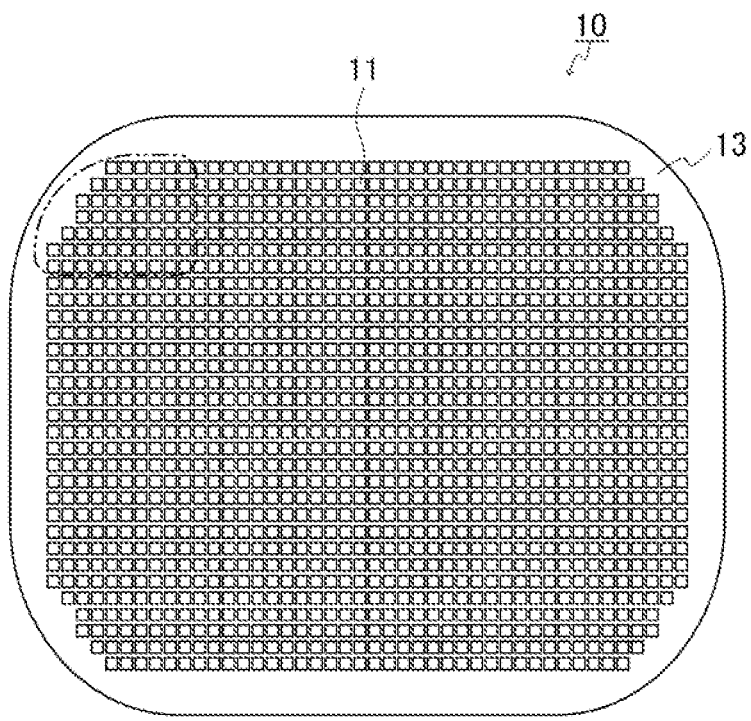
FIGS. 1A, 1B AND 1C are schematic diagrams showing an example of the configuration of an LED module of the first example embodiment.

In the LED module for flashing lamp of the present invention, for example, adjacent LEDs are separated from each other.

In the LED module for flashing lamp of the present invention, for example, the number of LEDs mounted on the mounting surface of the LED substrate is 4 to 25 per 120 mm$^2$.

In the LED module for flashing lamp of the present invention, for example, a distance between the adjacent LEDs is 0.2 to 0.5 mm.

In the LED module for flashing lamp of the present invention, for example, an LED has a width of 1.8 to 5.3 mm.

The LED module for flashing lamp of the present invention has, for example, an effective luminous intensity of 6,000 to 20,000 cd per flashing time of 1 to 5 msec.

The LED module for flashing lamp of the present invention has, for example, a brightness of 300,000 to 1,600,000 lumen (lm).

The flashing lamp according to the present invention is, for example, for flashing for the landing guidance of an aircraft.

As a result of the intensive research, the inventors of the present invention have found that breakage of the LED in the LED module is caused by expansion and contraction due to pulse lighting for a flash. That is, in production of a common small-area ultra-high luminous flux LED module, plural LED chips are mounted at high density on an LED substrate, and then a resin layer is uniformly formed on the entire region where the LED chips are mounted. When the LED module is used as a light source of a flashing lamp, pulse lighting of repeatedly turning on and off every several msec is required, which results in repetition of rapid thermal expansion and thermal contraction in the LED module. It has been found that, in the LED module, since the metal substrate and the resin layer stacked on the LED chip usually have different coefficients of thermal expansion, cracks occur in the resin layer, and the LED is damaged or broken by the cracks. Hence, the inventors have made the present invention in which the resin layer does not cover the entire region where the LED chips are mounted but the resin layer is stacked on each of the LEDs. According to the present invention, since the resin layer is stacked on each LED, for example, the force of thermal expansion or thermal contraction generated in a large resin layer covering the LEDs is not applied to one LED, and since the resin layer is individually formed on each LED, the force of thermal expansion or thermal contraction generated in each resin layer can also be reduced. Therefore, according to the LED module of the present invention, for example, even when the LED module is used as a light source of a flashing lamp that requires pulse lighting, the above-described breakage of the LED can be prevented as well as long-term reliability can be secured.

Descriptions will be made as regards the lamp of the present invention below more in detail with reference to the drawings. The present invention, however, is not limited to the following description. In the following FIGS. 1 to 3, identical parts are indicated with identical reference signs.

First Example Embodiment

The present example embodiment shows an example of an LED module for flashing lamp of the present invention. The LED module for flashing lamp of the present example embodiment is for a flashing lamp used in a flashing device for landing guidance of an aircraft, for example, but is not limited thereto. An example of the configuration of the LED module of the present example embodiment is shown in FIG. 1.

Figure 1B:
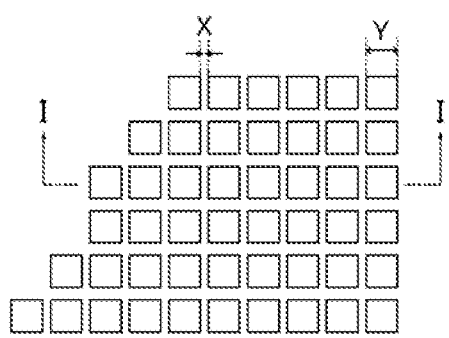
Figure 1C:
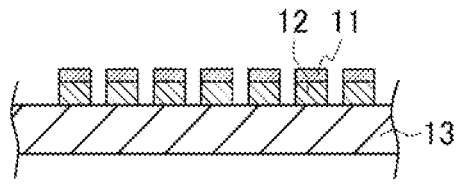

FIG. 1A is a plan view of an LED module 10, FIG. 1B is a partial plan view showing a region surrounded by the dotted line at the upper left in FIG. 1A, and FIG. 1C is a cross-sectional view taken along the line I-I in FIG. 1B. The LED module 10 includes an LED substrate 13, plural LEDs 12, and resin layers 11. The LEDs 12 are mounted on a mounting surface of the LED substrate 13, each resin layer 11 is stacked on the surface of each LED 12 opposite to the LED substrate 13, and adjacent resin layers 11 stacked on the LEDs 12 are separated from each other.

The LED module 10 serves as a light source in a flashing lamp. The type of the flashing lamp is not particularly limited, and may be, for example, a flashing lamp for landing guidance of an aircraft. As described above, a xenon lamp is generally used as the light source of the flashing lamp, and the module for flashing lamp of the present invention can be used as a substitute for the xenon lamp, for example. The luminous intensity of the LED module 10 can be appropriately determined, for example, depending on the application. As being the substitute for the xenon lamp, for example, the module preferably has the optical characteristics (e.g., luminous intensity, effective luminous intensity per predetermined flashing time, etc.) comparable to or higher than those of the xenon lamp. The optical characteristics of the LED module 10 can be appropriately set depending on, for example, the size of the LED module 10, the number of LEDs 12 per unit area, and the like.

The LED substrate 13 is not particularly limited, and may be, for example, an insulating substrate. Examples of the insulating substrate include a metal substrate made of aluminum, copper, or the like; and a resin substrate made of paper phenol, paper epoxy, glass composite, or the like. The size of the LED substrate 13 is not particularly limited, and can be appropriately determined depending on, for example, the size of the flashing lamp containing the LED module 10, the use location or the application of the flashing lamp, or the like. In the flashing lamp for landing guidance, the area of the region in the mounting surface where the LEDs 12 are mounted is, for example, 60 to 120 cm$^2$.

The LEDs 12 are stacked on the mounting surface of the LED substrate 13, and each resin layer 11 is stacked on the surface of each LED 12 opposite to the mounting surface of the LED substrate 13. In the LED module 10 of the present invention, it is only required that the adjacent resin layers 11 on the LEDs 12 are separated from each other. The adjacent LEDs 12 may be separated from each other as shown in FIG. 1, for example, whereas the present invention is not limited thereto, and the adjacent LEDs 12 may be in contact with each other.

The conditions for mounting the LEDs 12 on the LED substrate 13 are not particularly limited as described above, and can be appropriately set depending on the intended optical characteristics. The number of LEDs 12 mounted on the mounting surface of the LED substrate 13 is, for example, 4 to 25 per 120 mm$^2$. The total number of LEDs 12 mounted on the LED substrate 13 is, for example, 200 to 2,000.

The shape of the LED 12 is not particularly limited, and is generally a square shape or a rectangular shape. The size of the LED 12 is not particularly limited, and in the case of the square, the length of the side (arrow Y in FIG. 1) is, for example, 1.8 to 2.2 mm, 3 to 3.5 mm, or 4 to 5.3 mm, and in the case of the rectangle, the length of the short side is, for example, the same as the length of the square, and the ratio of the short side to the long side is, for example, 1:1 to 1:3. In the mounting surface of the LED substrate 13, when the adjacent LEDs 12 are separated from each other, the width between the adjacent LEDs 12 is, for example, 0.2 to 0.5 mm.

The resin layer 11 is stacked on the surface of the LED 12 as described above. The resin layer 11 is, for example, a phosphor resin layer containing a phosphor and a resin, and the color of light of the LED module 10 can be set by the phosphor. In the present invention, the type and the like of the phosphor are not limited by any means, and conventionally known phosphors can be used. Examples of the phosphor include $Y_3Al_5O_{12}$:Ce and $Tb_3Al_5O_{12}$:Ce.

The resin layer 11 can be formed, for example, by supplying a resin to the surface of the LED 12 and solidifying the resin. When the resin layer 11 is the phosphor resin layer, for example, the resin layer 11 can be formed by supplying a mixture of the phosphor and the resin to the surface of the LED 12 and solidifying the mixture. The type of the resin is not particularly limited, and examples thereof include an epoxy resin and a silicone resin. The ratio of the phosphor to the resin is not particularly limited, and, for example, the phosphor is 50 to 80 parts by weight with respect to 100 parts by weight of the resin. The mixture may include, for example, other additives in addition to the resin and the phosphor, and examples of the additive include silica and alumina.

A method of supplying the mixture to the surface of the LED 12 is not particularly limited, and the mixture may be applied or sprayed. Since the adjacent resin layers 11 need to be separated from each other as described above, the resin layers 11 may be formed by supplying the mixture to the surfaces of the exposed LEDs 12 by using, for example, a pattern mask covering the space between the LED 12 and the LED 12 so that the adjacent resin layers 11 are separated from each other. The method of solidification is not particularly limited, and may be, for example, a drying treatment or the like.

A width (arrow X in FIG. 1) between the adjacent resin layers 11 is not particularly limited, and is, for example, 0.2 to 0.5 mm. A thickness of the resin layer 11 is not particularly limited, and is, for example, 100 to 300 μm.

The resin layer 11 may be formed on the entire surface of the LED 12 or a part of the surface of the LED 12. In the latter case, the resin layer 11 is preferably stacked on, for example, the region of 90% or more of the surface of one LED 12.

Since the LED module 10 of the present invention can be a substitute for a xenon lamp in a flashing lamp as described above, the optical characteristics thereof are preferably set as follows, for example. The LED module 10 has a luminous intensity (cd) of, for example, 6,000 to 20,000 or 60,000 to 200,000. In the present invention, the luminous intensity means an effective luminous intensity. The unit of the light output of the flashing lamp is the effective luminous intensity (cd). The effective luminous intensity of the LED module 10 is, for example, 6,000 to 20,000 cd per flashing time of 1 to 5 msec. In the present invention, the effective luminous intensity (cd) per unit of flashing time is expressed by the value calculated by the relational expression (Blondel-Rey-Douglas equation) between the light emission luminous intensity (luminous intensity (cd) at the moment of flashing) and the light emission time. The effective luminous intensity (Ie) can be expressed by, for example, the following equation.

$$Ie = \frac{\int_{t_1}^{t_2} I(t)dt}{a + (t_2 - t_1)} \qquad \text{Equation 1}$$
$$a = 0.21$$

t1, t2: value at which Ie shows maximum value during flashing time
I(t): luminous intensity at time t Second Example Embodiment The present example embodiment shows an example of a flashing lamp of the present invention. The flashing lamp of the present example embodiment includes the LED module of the present invention, and is used in a flashing device for landing guidance of an aircraft, for example, but is not limited thereto. An example of the configuration of the flashing lamp of the present example embodiment is shown in FIG. 2.

Figure 2:
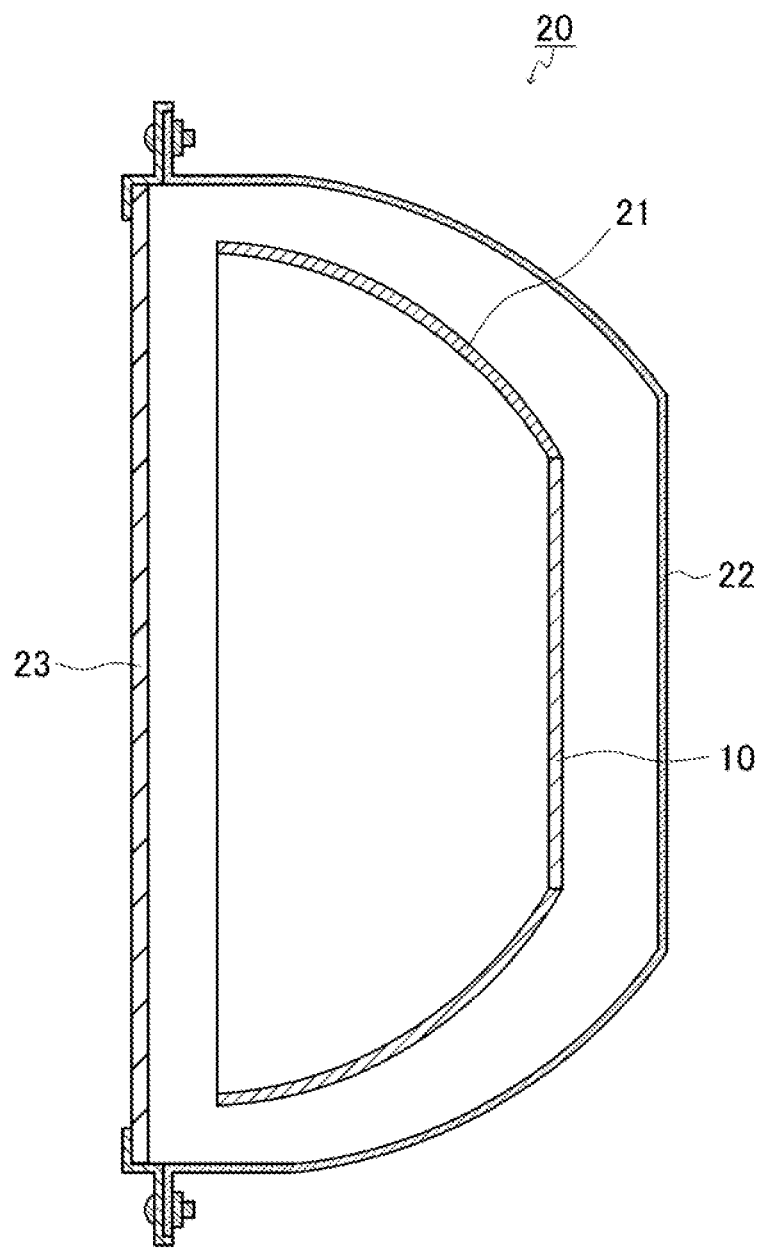
FIG. 2 is a cross-sectional view showing an example of the configuration of a flashing lamp of the second example embodiment.

FIG. 2 is a cross-sectional view showing an example of the flashing lamp of the present example embodiment. A flashing lamp 20 includes an LED module 10 as a light source, a light distribution unit 21, a housing 22 having an opening, and a light transmissive cover 23. The LED module 10 is the LED module 10 of the first example embodiment. The LED module 10 and the light distribution unit 21 are disposed inside the housing 22, and the light transmissive cover 23 is disposed over the opening of the housing 22. Regarding the LED module 10, the reference can be made to the description of the first example embodiment.

The light distribution unit 21 is disposed on the light emission side of the LED module 10. That is, in FIG. 2, the light distribution unit 21 is disposed in the direction in which the LED module 10 emits light (on the left side relative to the LED module 10). The light distribution unit 21 is a unit configured to transmit the light emitted by the LED module 10 to the light transmissive cover 23 side by, for example, reflection, condensation, diffusion, or the like. The type of the light distribution unit 21 is not particularly limited, and examples thereof include a reflector and a lens. The light distribution unit 21 may be, for example, one of the reflector and the lens, or a combination of the reflector and the lens.

When the light distribution unit 21 is a reflector, the material for forming the reflector is not particularly limited, and examples thereof include metals such as aluminum, magnesium, and alloys thereof, and the like; and resins such as PC (polycarbonate), PBT (polybutylene terephthalate), and the like. As the reflector, for example, a reflector whose reflection efficiency is further improved by applying high reflection processing on the reflection surface may be used. The high reflection processing is, for example, plating, application of a high reflection paint, or the like.

When the light distribution unit 21 is a reflector, the shape of the reflector is not particularly limited. The reflector has, for example, a cylindrical shape as shown in FIG. 2. It is preferable that the LED-mounting region in the mounting surface of the LED module 10 is located at one of openings of the cylindrical reflector (on the right side in FIG. 2) and the light from the LED module 10 is emitted to the inside of the cylindrical reflector. For example, as shown in FIG. 2, the cylindrical reflector may have a tapered shape whose inner wall widens as it extends from the LED module 10 toward the opening of the housing 22, and this shape may be referred to as an umbrella shape, for example. The cross section of the inner wall of the cylindrical reflector extending from the LED module 10 toward the opening of the housing 22 may have, for example, an arc shape as shown in FIG. 2, or may have a flat straight shape.

The light distribution unit 21 may be, for example, a lens as described above. The lens is disposed on the mounting surface side of the LDE module 10, for example, so as to receive light emitted from the LED module 10 and to distribute the light by diffusion, scattering, or the like. The lens may be, for example, a convex lens having a spherical surface on the side of the opening of the housing 22.

The material for forming the housing 22 is not particularly limited and examples thereof include aluminum and resins. The shape of the housing 22 is not particularly limited, and may be, for example, an umbrella shape as shown in FIG. 2.

The light transmissive cover 23 is disposed so as to cover the opening of the housing 22, and light from the inside of the housing 22 transmits the light transmissive cover 23. The material for forming the light transmissive cover 23 is not particularly limited as long as most of the light emitted from the LED module 10 can transmits therethrough, and a specific example thereof is glass or the like.

As described above, the optical characteristic of the flashing lamp of the present invention can be set as desired depending on the number of mounted LEDs per unit area, the total number of LEDs, the size of the LED substrate, and the like in the LED module. Thus, the flashing lamp of the present invention can be configured, for example, so as to have optical characteristics comparable to or better than existing xenon lamps, e.g., the required effective luminous intensity per desired flashing time. For this reason, for example, the flashing lamp of the present invention can be totally replaced with xenon lamps, partially replaced with xenon lamps, or sequentially replaced with xenon lamps in an existing sequenced flashing light.

Figure 3:
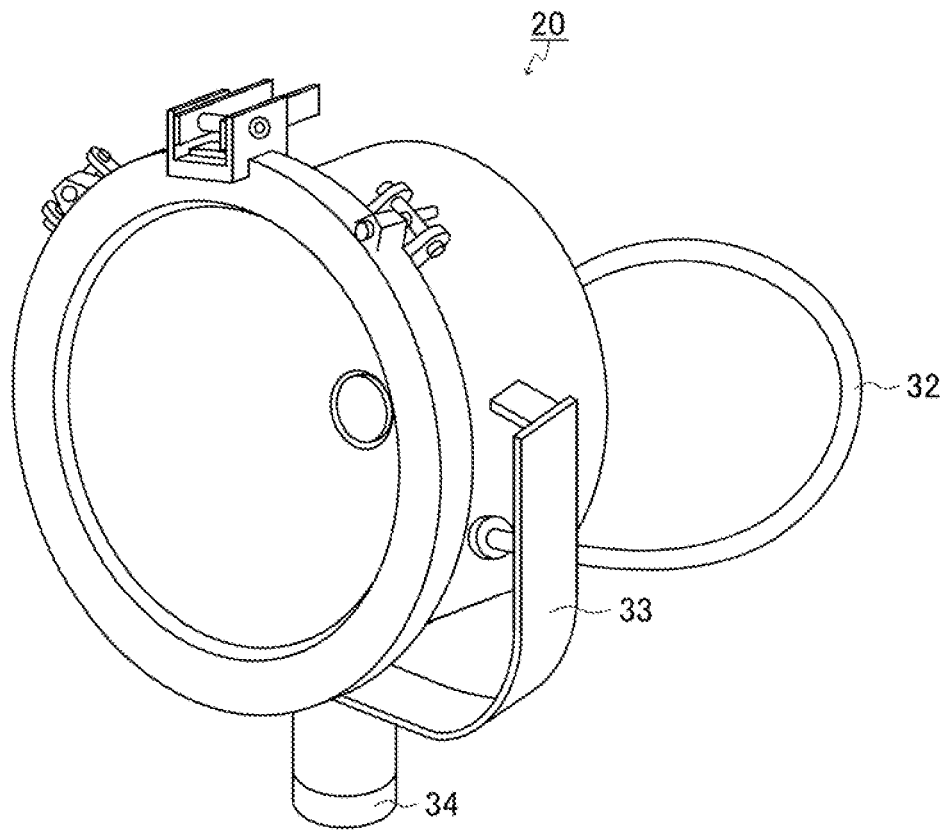
FIG. 3 is a perspective view showing an example of installation of a lamp of the first example embodiment.

An installation example of the flashing lamp 20 of the present example embodiment is described below with reference to FIG. 3. In addition to the configuration of FIG. 2, for example, the lamp 20 of the present example embodiment may further include an arm 33 and a leg 34 and may be installed on the ground by the leg 34. The flashing lamp 20 of the present example embodiment may further include, for example, a cable 32 for supplying power to the LED module 10. Furthermore, the flashing lamp 20 of the present example embodiment may be installed on a pole provided on the ground, for example, and the number thereof is not particularly limited.

The flashing lamp 20 of the present example embodiment is configured to achieve flashing 120 times per minute, for example. For example, when the flashing lamp 20 is provided in a large airport having a plurality of runways, 8 to 29 flashing lamps 20 are arranged at intervals of about 30 m from the approach direction of the aircraft toward the end of the runway. Furthermore, for example, when the flashing lamp 20 is provided in a small airport where the number of arrival and departure of an aircraft is small and is provided with only one short runway, one flashing lamp 20 is arranged at each side of the runway end in the short direction so as to flash (blink) a total of two lamps simultaneously. Furthermore, when the flashing lamp 20 is installed in an airport where an aircraft cannot enter the runway straight, for example, the flashing lamp 20 is strategically arranged at a predetermined position on the approach to the runway, for example, every several kilometers. The flashing lamp 20 is configured such that the brightness can be switched to three levels in accordance with, for example, the standard specification of the Ministry of Land, Infrastructure, Transport and Tourism. Among these three levels of brightness, "High", which is the brightest level, is used, for example, in the daytime of poor visibility due to fog, rain, or the like, "Low", which is the darkest level, is used, for example, in the night, and "Middle", which is the intermediate level, is used, for example, in the evening.

While the present invention has been described above with reference to illustrative example embodiments, the present invention is by no means limited thereto. Various changes and variations that may become apparent to those skilled in the art may be made in the configuration and specifics of the present invention without departing from the scope of the present invention.

This application claims priority from Japanese Patent Application No. 2017-016036 filed on Jan. 31, 2017. The entire subject matter of the Japanese Patent Application is incorporated herein by reference.

INDUSTRIAL APPLICABILITY

According to the present invention, even if the LED module is used in a flashing lamp, breakage of a LED chip due to pulse lighting for a flash can be prevented.

REFERENCE SIGNS LIST

10 LED module
11 resin layer
12 LED
13 LED substrate
20 flashing lamp
21 light distribution unit
22 housing
23 light transmissive cover

The invention claimed is:

1. An LED module for a flashing lamp, the LED module comprising:
    an LED substrate;
    plural LEDs; and
    plural resin layers,
    wherein the LEDs are mounted on a mounting surface of the LED substrate,
    wherein each resin layer is stacked on a surface of each LED opposite to the LED substrate,
    wherein adjacent resin layers stacked on the LEDs are separated from each other,
    wherein adjacent LEDs are separated from each other,
    wherein the width between the adjacent LEDs is 0.2 to 0.5 mm,
    wherein the total number of LEDs mounted on the LED substrate is 200 to 2,000, and
    wherein a thickness of the resin layer is 100 to 300 μm.

2. The LED module according to claim 1, wherein a shape of the LEDs is a square shape or a rectangular shape, and the LEDs have a width of 1.8 to 5.3 mm.

3. A flashing lamp comprising:
    an LED module serving as a light source;
    a light distribution unit;
    a housing having an opening; and
    a light transmissive cover,
    wherein the LED module is the module according to claim 1,
    wherein the LED module and the light distribution unit are disposed inside the housing,
    wherein the light distribution unit is disposed on a light emission side of the LED module,
    wherein the light transmissive cover is disposed over the opening of the housing,
    wherein the flashing lamp includes:
        an arm;
        a leg; and
        a cable for supplying power to the LED module for flashing for landing guidance of an aircraft,
    wherein the flashing lamp is configured to achieve flashing 120 times per minute, and
    wherein the flashing lamp is configured to use three levels of brightness.

4. The LED module according to claim 1, wherein the flashing lamp is configured for flashing for landing guidance of an aircraft.

5. The LED module according to claim 1, wherein the LED module has an effective luminous intensity of 6,000 cd to 20,000 cd per flashing time of 1 to 5 msec.

6. The LED module according to claim 1, wherein the LED module has a brightness of 300,000 to 1,600,000 lumen (lm).

* * * * *